United States Patent
Suzuki

[11] Patent Number: 6,125,039
[45] Date of Patent: Sep. 26, 2000

[54] HYBRID MODULE

[75] Inventor: Kazutaka Suzuki, Tokyo, Japan

[73] Assignee: Taiyo Yuden Co., Ltd., Tokyo, Japan

[21] Appl. No.: 09/282,055

[22] Filed: Mar. 29, 1999

Related U.S. Application Data

[63] Continuation-in-part of application No. 08/895,397, Jul. 16, 1997.

[30]     Foreign Application Priority Data

Jul. 31, 1996   [JP]   Japan .................................... 8-219272

[51] Int. Cl.$^7$ ........................................................ H05K 7/20
[52] U.S. Cl. .......................... 361/720; 361/704; 361/719;
361/761; 361/762; 361/764; 361/728; 361/736;
257/713; 257/717; 174/252; 165/80.2
[58] Field of Search .................................... 361/704, 707,
361/717–720, 736, 743, 761, 762, 763,
764, 784, 803, 804; 257/706, 707, 712,
713, 720, 796; 174/252, 260–263; 165/80.2,
185

[56]              References Cited
                U.S. PATENT DOCUMENTS

| | | | |
|---|---|---|---|
| 4,677,526 | 6/1987 | Meuhling | 361/718 |
| 4,755,910 | 7/1988 | Val | 361/361 |
| 4,949,224 | 8/1990 | Yamamura et al. | 361/784 |
| 4,958,258 | 9/1990 | Charruau | 361/715 |
| 4,996,630 | 2/1991 | Liquori et al. | 361/803 |
| 5,130,768 | 7/1992 | Wu et al. | 257/724 |
| 5,262,351 | 11/1993 | Bureau et al. | 257/81 |
| 5,367,434 | 11/1994 | Griffin et al. | 361/719 |
| 5,650,920 | 7/1997 | Pfizenmayer | 361/782 |
| 5,751,555 | 5/1998 | Pfizenmayer et al. | 361/763 |
| 5,877,550 | 3/1999 | Suzuki | 257/700 |

*Primary Examiner*—Leo P. Picard
*Assistant Examiner*—Boris L. Chervinsky
*Attorney, Agent, or Firm*—Flynn, Thiel, Boutell & Tanis, P.C.

[57]                ABSTRACT

A hybrid module comprising a circuit board, a heat generating circuit component mounted on the circuit board and a mother board on which the circuit board is mounted, wherein the circuit component is mounted on the circuit board opposing the mother board, and the surface of the circuit component is fixed to a thermally conductive member having a shape like a film and formed on the mother board. With such an arrangement, heat generated in the circuit component is transmitted to the mother board via the thermally conductive member.

18 Claims, 5 Drawing Sheets

HYBRID MODULE

CROSS REFERENCE TO RELATED APPLICATION

This is a continuation-in-part of copending U.S. application Ser. No. 08/895 397, filed Jul. 16, 1997.

BACKGROUND OF THE INVENTION

1. Field of the Invention

The present invention relates to a hybrid module comprising a circuit board having a circuit pattern thereon and chip components such as a multilayer capacitor and a multilayer inductor, and semiconductor components respectively mounted on the circuit board, thereby constituting a circuit, more particularly to a hybrid module having a circuit board on which heat generating circuit components such as a field effect transistor and a power semiconductor device are mounted.

2. Description of Related Art

In a conventional hybrid module having a circuit board on which heat generating circuit components such as a field effect transistor and a power semiconductor are mounted, a special dissipating means is provided for dissipating heat from the circuit components. For example, in the hybrid module disclosed in JP-A 5-13627, a dissipating fin is provided on a circuit board, and heat generating circuit components mounted on the circuit board are connected with the dissipating fin via a thermally conductive member having a shape like a leaf spring. In this hybrid module, heat generated in the circuit components is discharged to the atmosphere via the dissipating fin.

There is another conventional hybrid module having a circuit board on which heat generating components are mounted as illustrated in FIG. 9. In this hybrid module, aluminum nitride is employed as a circuit board 1, and circuit components 7 and 7, each having a shape like a chip, are mounted on land electrodes 6 and 6 formed on the circuit board 1, and further, a circuit component 3, such as a heat generating semiconductor device, is mounted on the land electrodes 4 and 4 via a soldering bump 5. The circuit board 1 is mounted on a mother board (board 9) and terminal electrodes 8 and 8 of the circuit board 1 are connected with land electrodes 10 and 10 formed on the mother board (board 9). Further, the circuit board 1 and mother board (board 9) are connected with each other at opposing surfaces thereof via a conductive film 2 which has a good thermal conductivity and is formed on the mother board (board 9).

Aluminum nitride is noted as an insulating material having good thermal conductivity. In the aforementioned hybrid module, heat generated in the circuit component 3 mounted on the circuit board 1 is transmitted to the mother board 9 via the circuit board 1 respectively made of aluminum nitride and conductive film 2 and is dissipated.

In the abovementioned hybrid module disclosed in JP-A 5-13627, heat which is generated at the circuit component 3 via the dissipating fin is dissipated in the atmosphere, and hence the surface area of the dissipating fin is inevitably required to be as large as possible to enhance the heat dissipating efficiency. Accordingly, a space occupied by the dissipating fin is made large in the hybrid module, which causes a problem that the hybrid module is difficult to miniaturize.

On the other hand, the aforementioned other hybrid module as illustrated in FIG. 9 dispenses with a dissipating fin because heat generated in the electronic device 3 is dissipated to the mother board 9 via the circuit board 1, and also the space occupied by the dissipating fin is omitted, namely, the hybrid module is not enlarged in its capacity because the circuit board 1 serves also as a heat dissipating or dissipating means. However, although alumina nitride has a good thermal conductivity, it is very expensive compared with a general substrate material made of, for example, alumina, which causes a problem of high cost.

SUMMARY OF THE INVENTION

It is an object of the invention to provide a hybrid module for dissipating heat generated in a circuit component 14 after it is transmitted to a mother 19 and not for dissipating the heat to the atmosphere via a dissipating fin, wherein the heat can be dissipated from the circuit component 14 to the mother board 19 without using expensive aluminum nitride.

To achieve the above object, the present invention comprises a circuit board 11, a mother board 19, a circuit component 14 mounted on a surface of the circuit board 11 opposing the mother board 19 so that heat generated in the circuit component 14 is transmitted from the circuit component 14 to the mother board 19 directly or via a thermally conductive member 21. As a result, it is possible to obtain a hybrid module having a small capacity and which also can use a circuit board made of general alumina ceramics without using aluminum nitride having a good thermal conductivity.

That is, the hybrid module of the invention comprises a circuit board 11, a heat generating circuit component 14 mounted on the circuit board 11, and a mother board 19 on which the circuit board 11 is mounted, wherein the circuit component 14 is mounted on a surface of the circuit board 11 opposing the mother board 19 so as to transmit heat from the circuit component 14 to the mother board 19.

For example, the circuit component 14 is mounted in a recessed part 12 defined in the main surface of the circuit board 11 opposing the mother board 19. A thermally conductive member 21 having a shape like a film is formed on the mother board 19, and a package of the circuit component 14 is fixed to the thermally conductive member 21 at a surface thereof. In such a structure, heat generated in the circuit component 14 is transmitted to the mother board 19 via the thermally conductive member 21.

With such an arrangement of the hybrid module, since heat generated in the circuit component 14 is transmitted to the mother board 19 directly or via the thermally conductive member 21, and is dissipated thereafter, it is not necessary that the circuit board 11 is especially made of aluminum nitride having a good conductivity but it may be made of general alumina ceramics. That is, the hybrid module of this invention can use a circuit board made of less expensive alumina or a glass-epoxy resin without using a circuit board made of expensive aluminum nitride, thereby reducing the cost thereof. Further, since the hybrid module of the invention dissipates heat after transmitting it to the mother board 19 without dissipating heat to the atmosphere, it thereby dispenses with a dissipating fin, etc. As a result, the size of the hybrid module can be reduced.

PREFERRED EMBODIMENT OF THE INVENTION

Figure 1:
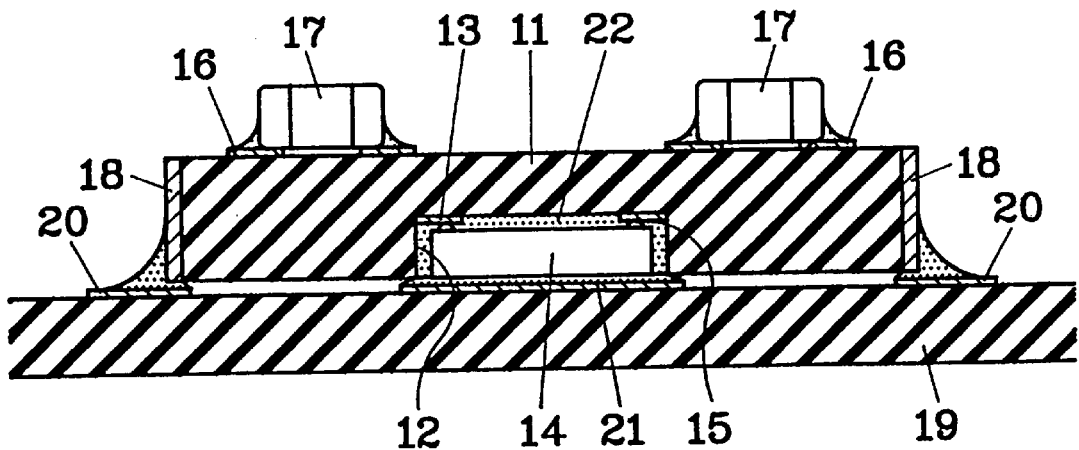
FIG. 1 is a vertical cross-sectional side view of a hybrid module according to a first example of the present invention.

A hybrid module of the present invention will be now described in detail with reference to FIGS. 1 to 8 showing first to eighth examples thereof.

A recessed part 12 is defined in a main surface of a circuit board 11, which is made of an insulating material such as a glass-epoxy resin and has a circuit pattern (not shown) formed thereon. The recessed part 12 is formed, for example, by laser working to conform to the shape of a circuit component 14 which is mounted therein, and it has dimensions (length, width and depth) slightly larger than those of the circuit component 14. Land electrodes 13 and 13 are formed on a bottom surface of the recessed part 12 to be connected with terminal electrodes of the circuit component 14. Terminal electrodes are provided only on the surface of the circuit component 14 facing the land electrodes 13. The circuit board 11 has a multilayer structure, not shown, and also has a circuit pattern at the inside thereof, and the electrodes 13 and 13 are connected with this circuit pattern.

The circuit component 14 formed of a heat generating semiconductor device, etc. is accommodated in the recessed part 12 of the circuit board 11, and the terminal electrodes of the circuit component 14 are connected with the land electrodes 13 and 13. For example, a heat generating semiconductor device serving as the circuit component 14 is accommodated in the recessed part 12, and soldering bumps 15 and 15 of the circuit component 14 are soldered onto the land electrodes 13 and 13. In this state, the surface of the circuit component 14 is substantially flush with the main surface of the circuit board 11. Thereafter, a filling flat 22 is filled in the recessed part 12, thereby filling the recessed part 12 except for one surface of the circuit component 14 directed from the opening of the recessed part 12 to the outside.

Thereafter the circuit board is turned upside down to permit the recessed part 12 in which the circuit component 14 of the circuit board 11 is mounted to be directed downward, and circuit components 17 and 17, such as chips, are mounted on the main surface of the circuit board 11, and terminal electrodes of the circuit components 17 and 17 are soldered onto land electrodes 16 and 16.

Further, the circuit board 11 is mounted on the mother board 19, and terminal electrodes 18 and 18 provided on both side surfaces of the circuit board 11 are soldered onto land electrodes 20 and 20 on the mother board 19. The terminal electrodes 18 and 18 are formed of conductive films. A conductive film is a thermally conductive member 21 previously formed on the mother board 19 together with the land electrodes 20 and 20 at the position corresponding to the circuit component 14. At the same time, when the terminal electrodes 18 and 18 of the circuit board 11 are soldered onto the land electrodes 20 and 20, the surface of the circuit component 14 is soldered onto the thermally conductive member 21.

As a result, the hybrid module shown in FIG. 1 is completed. In this hybrid module, heat generated in the circuit component 14, such as a heat generating semiconductor device, is transmitted to the mother board 19 via the thermally conductive member 21 and then it is dissipated.

Figure 2:
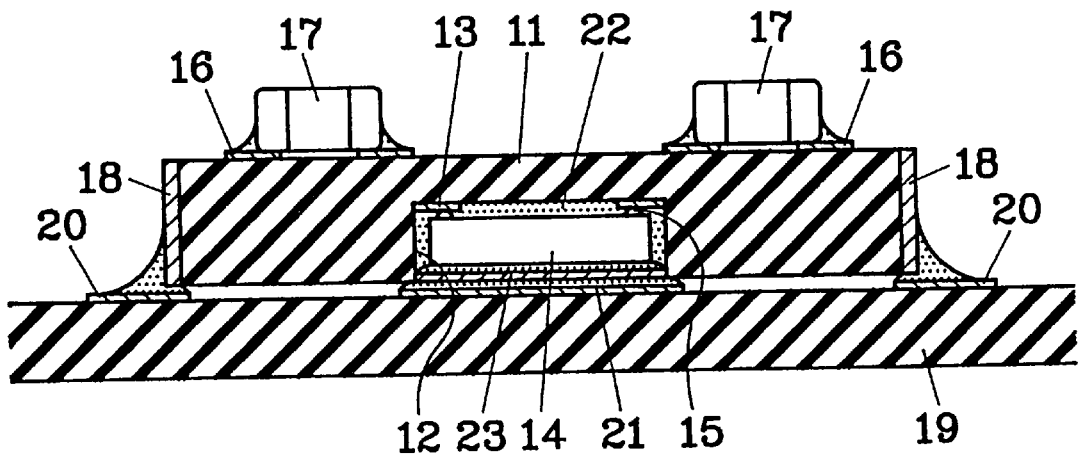
FIG. 2 is a vertical cross-sectional side view of a hybrid module according to a second example of the present invention.

Although the surface of the circuit component 14 is directly soldered onto the thermally conductive member 21 according to the first example in FIG. 1, a metallic plate 23, such as copper, having good conductivity is previously soldered onto the surface of the circuit component 14 and the metallic plate 23 is soldered onto the thermally conductive member 21 according to the second example in FIG. 2. Accordingly, the difference between the heat of the circuit component 14 and the depth of the recessed part 12 is adjusted, and hence, heat can be smoothly transmitted from the circuit component 14 to the mother board 19.

Figure 3:
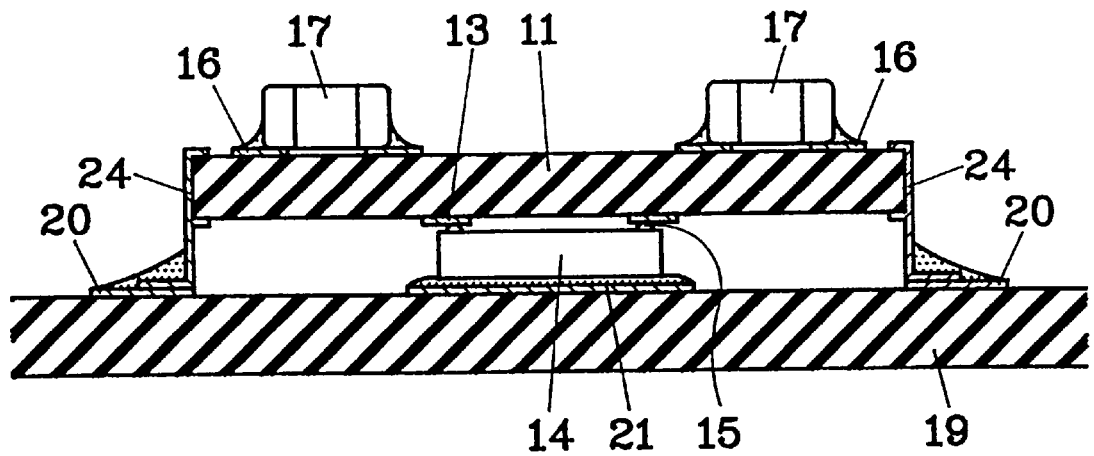
FIG. 3 is a vertical cross-sectional side view of a hybrid module according to a third example of the present invention.

According to the third example in FIG. 3, the recessed part 12 is not defined in the circuit board 1 but the heat generating circuit component 14 is mounted on the lower surface of the circuit board 11. The thermally conductive member 21, formed of a conductive film, is formed on the mother board 19 at the position corresponding to the circuit component 14. Lead terminals 24 and 24 are attached to both side surfaces of the circuit board 11. When the lead terminals 24 and 24 are soldered onto the land electrodes 20 and 20 of the mother board 19, the lower surface of the circuit component 14 is substantially brought into contact with the surface of the thermally conductive member 21. At the same time, when the lead terminals 24 and 24 are soldered onto the land electrodes 20 and 20, the surface of the circuit component 14 is soldered onto the thermally conductive member 21. The lead terminals 24 and 24 are formed by cutting a member having a shape like a metallic plate in the shape like a belt and bending it.

Figure 4:
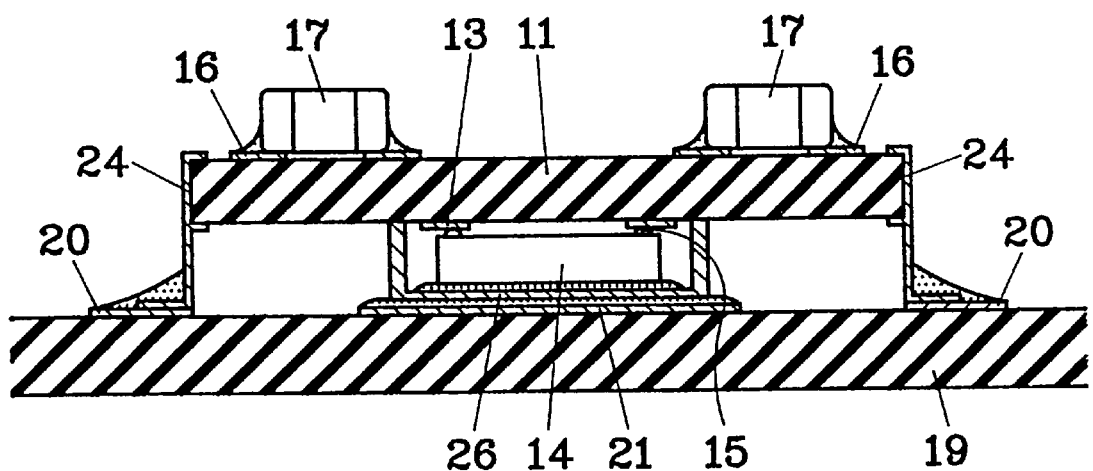
FIG. 4 is a vertical cross-sectional side view of a hybrid module according to a fourth example of the present invention.

According to the fourth example in FIG. 4, the circuit component 14 mounted on the circuit board 11 in the third example shown in FIG. 3 is surrounded by a heat dissipating member 26 having high conductivity and having a shape like a metallic box, and the lower surface of the circuit component 14 is soldered onto an upper inner surface of the heat dissipating member 26, and further the lower surface of the heat dissipating member is soldered onto the thermally conductive member 21. In the fourth example, heat generated in the circuit component 14 is transmitted to the heat dissipating member 26, and a part of the heat is dissipated to the atmosphere from the heat dissipating member 26, and the remaining part of the heat is transmitted to the mother board 19 via the heat dissipating member 26. As a result, the hybrid module can achieve more efficient heat dissipation.

Figure 5:
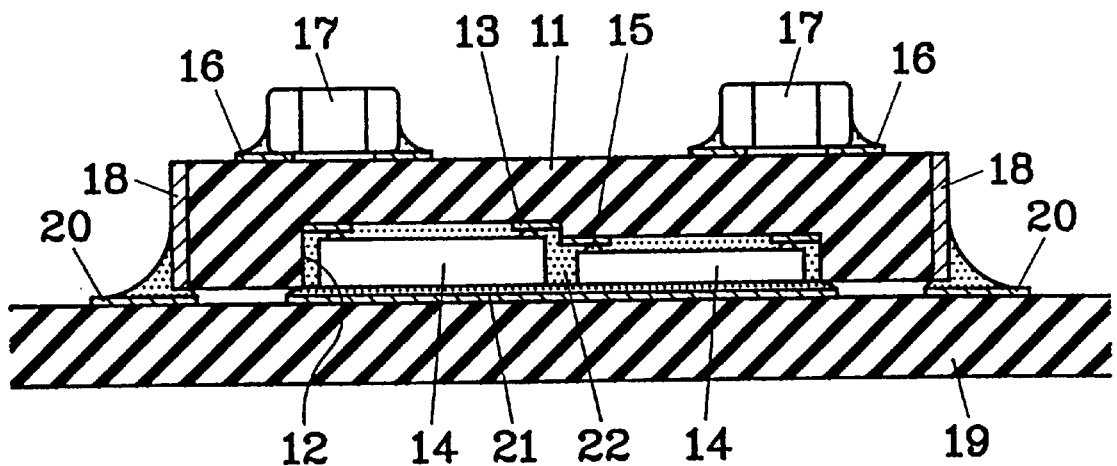
FIG. 5 is a vertical cross-sectional side view of a hybrid module according to a fifth example of the present invention.

According to the fifth example in FIG. 5, the circuit component 14 in the second example in FIG. 2 is doubled, that is, two circuit components 14 and 14 having different thicknesses are mounted. In the fifth example, since the depth of the recessed part 12 is varied at the portion where the circuit components 14 and 14 are mounted, lower surfaces of the circuit components 14 and 14 are substantially flush with the lower main surface of the circuit board 11 so that the circuit components 14 and 14 are suitably mounted in the recessed part 12. The lower surfaces of the circuit components 14 and 14 are soldered onto the surface of the thermal conductive member 21 on the mother board 19 in the same manner as the second example in FIG. 2.

Figure 6:
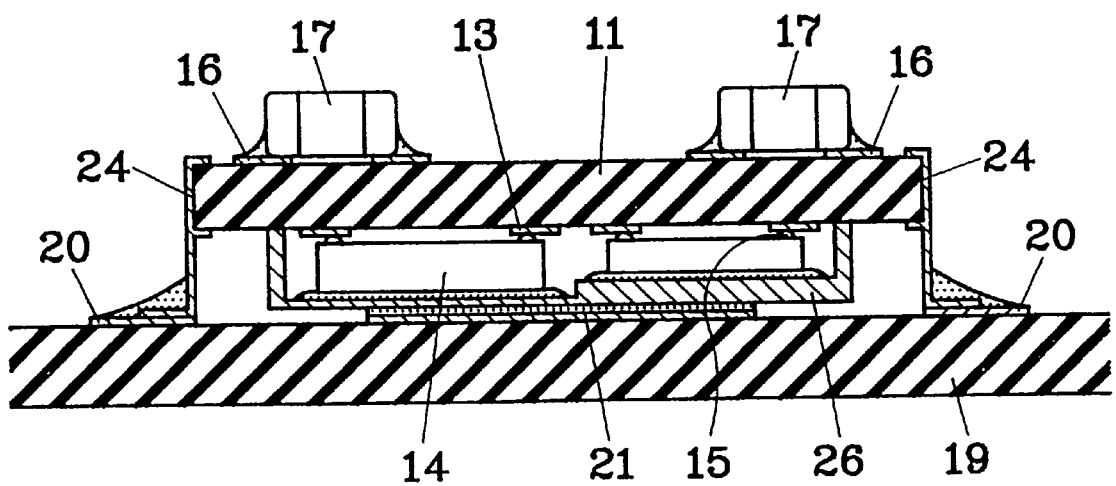
FIG. 6 is a vertical cross-sectional side view of a hybrid module according to a sixth example of the present invention.

According to the sixth example in FIG. 6, two circuit components 14 and 14 having different thicknesses in the fourth example as shown in FIG. 4 are mounted on the heat dissipating member 26. In this example, the thickness of the heat dissipating member 26 on which the circuit components 14 and 14 are mounted is varied and also the height thereof at the upper inner surface thereof is also varied so that the circuit components 14 and 14 are bonded onto the heat dissipating member 26 while the lower surfaces of the former are substantially brought into contact with the upper inner surface of the latter. The circuit components 14 and 14 and the heat dissipating member 26 are bonded with each other via an adhesive made of an epoxy resin or a silicone resin, or they may contact each other by way of a viscous material such as a silicone grease. The lower surface of the heat dissipating member 26 is soldered onto the surface of the thermally conductive member 21 on the mother board 19 in the same manner as the fourth example shown in FIG. 4.

Figure 7:
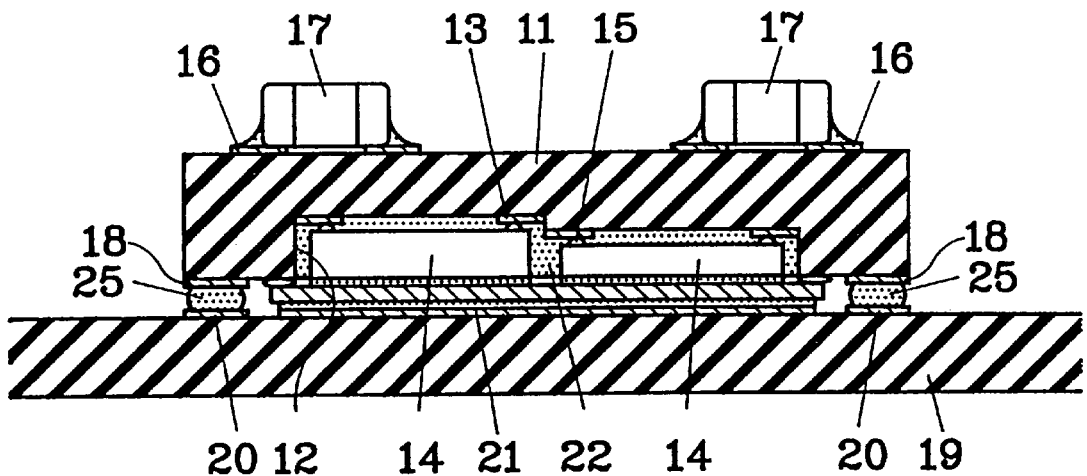
FIG. 7 is a vertical cross-sectional side view of a hybrid module according to a seventh example of the present invention.

According to the seventh embodiment in FIG. 7, the terminal electrodes 18 and 18 are provided on both sides of the bottom of the circuit board 11 in the fifth embodiment shown in FIG. 5, and the land electrodes 20 and 20 are provided on the mother board 19 at the position corresponding to the terminal electrodes 18 and 18. The terminal electrodes 18 and 18 of the circuit board 11 are soldered onto the land electrodes 20 and 20 on the mother board 19 while solders 25, each having a shape like a ball and interposed therebetween, are subject to reflowing and recurring treatments. In this example, since the soldering can be made between the bottom surfaces of the circuit board 11 and the mother board 19 and not between the side surface of the circuit board 11 and the mother board 19, the space of the circuit board 11 to be mounted on the mother board 19 can be reduced, thereby enhancing the mounting or packing density.

Figure 8:
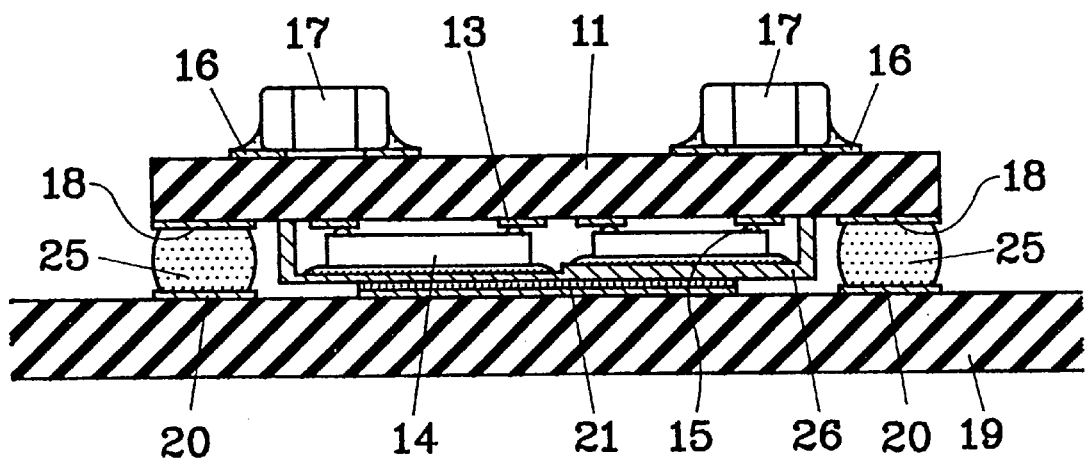
FIG. 8 is a vertical cross-sectional side view of a hybrid module according to an eighth example of the present invention.
Figure 9:
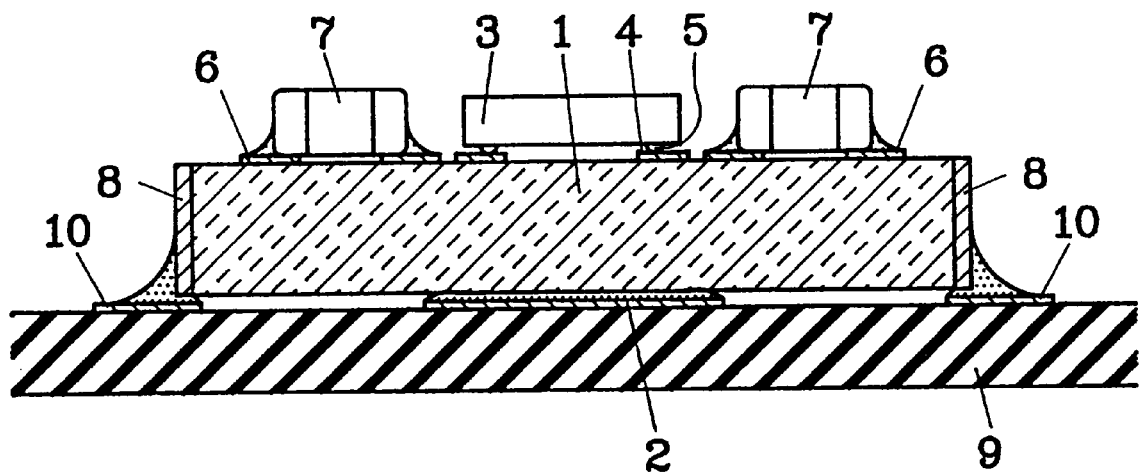
FIG. 9 is a vertical cross-sectional side view of a conventional hybrid module.

According to the eighth embodiment in FIG. 8, the terminal electrodes 18 and 18 are provided on both sides of the bottom of the circuit board 11 in the sixth embodiment shown in FIG. 6, and the terminal electrodes 18 and 18 are soldered onto the land electrodes 20 and 20 on the mother board 19 via the solders 25 having a shape of a ball. Also in this example, the space of the circuit board 11 to be mounted on the mother board 19 can be reduced, thereby enhancing mounting or packing density.

What is claimed is:

1. A hybrid module comprising:
    a circuit board having a recess formed in a main surface thereof;
    a mother board mounted to said circuit board at said main surface thereof;
    a heat generating circuit component mounted in the recess, said circuit component having a main surface which is substantially flush with the main surface of said circuit board and having electrodes provided only on a surface opposite to its main surface; and
    a thermally conductive film member provided between said mother board and said main surface of said circuit component.

2. The hybrid module according to claim 1, wherein the main surface of said circuit board is soldered on said thermally conductive film member.

3. The hybrid module according to claim 1, wherein the main surface of said circuit board has either an epoxy resin or a silicon resin provided thereon.

4. The hybrid module according to claim 1, wherein said circuit component is sealed within said recess with a resin except for the main surface thereof.

5. The hybrid module according to claim 1, wherein said thermally conductive film member is made from a metal plate.

6. The hybrid module according to claim 1, wherein said recess has a diameter greater than that of the circuit component contained therein.

7. The hybrid module according to claim 6, wherein terminal electrodes are provided on a lower surface of the circuit board, and the terminal electrodes and land electrodes of the mother board are connected with each other via solder interposed therebetween and having the shape of a ball.

8. The hybrid module according to claim 1, wherein a circuit arranged on the circuit board is connected with a mother board circuit by soldering lead terminals formed from a metal plate member provided on the circuit board onto land electrodes provided on the mother board.

9. The hybrid module according to claim 1, wherein a circuit arranged on the circuit board is connected with a mother board circuit by soldering terminal electrodes formed from a metallic film member provided on the circuit board onto land electrodes provided on the mother board.

10. A hybrid module comprising:
    a circuit board having at least two recesses formed in a main surface thereof;
    a mother board mounted to said circuit board at said main surface thereof;
    a heat generating circuit component mounted in each of the recesses, said circuit components each having a main surface which is substantially flush with the main surface of said circuit board and having electrodes provided only on the surface opposite to its main surface; and
    at least two thermally conductive film members, each of the thermally conductive film members being provided between a circuit component main surface and the mother board.

11. The hybrid module according to claim 10, wherein the main surface of said circuit board is soldered on said thermally conductive film members.

12. The hybrid module according to claim 10, wherein the main surface of said circuit board has either an epoxy resin or a silicon resin provided thereon.

13. The hybrid module according to claim 10, wherein at least one of said circuit components is sealed within one of said recesses with a resin except for the main surface thereof.

14. The hybrid module according to claim 10, wherein at least one of said thermally conductive film members is made from a metal plate.

15. The hybrid module according to claim 10, wherein said thermally conductive film members are made from distinct metal plates and each of said thermally conductive film members has a thickness corresponding to the thickness of the circuit component to be mounted so that the main surface of said circuit component is located substantially flush with the main surface of said circuit board.

16. The hybrid module according to claim 10, wherein at least one of said recesses have a diameter greater than the circuit component contained therein.

17. The hybrid module according to claim 10, wherein a circuit arranged on the circuit board is connected with a mother board circuit by soldering lead terminals formed from a metal plate member provided on the circuit board onto land electrodes provided on the mother board.

18. The hybrid module according to claim 10, wherein a circuit arranged on the circuit board is connected with a mother board circuit by soldering terminal electrodes formed from a metallic film member provided on the circuit board onto land electrodes provided on the mother board.

* * * * *